United States Patent
Lindolf et al.

(10) Patent No.: US 6,919,234 B2
(45) Date of Patent: Jul. 19, 2005

(54) METHOD FOR PRODUCING AN ANTIFUSE IN A SUBSTRATE AND AN ANTIFUSE STRUCTURE FOR INTEGRATION IN A SUBSTRATE

(75) Inventors: Jürgen Lindolf, Friedberg (DE); Florian Schamberger, München (DE)

(73) Assignee: Infineon Technologies AG, Munich (DE)

(*) Notice: Subject to any disclaimer, the term of this patent is extended or adjusted under 35 U.S.C. 154(b) by 48 days.

(21) Appl. No.: 10/724,007

(22) Filed: Nov. 26, 2003

(65) Prior Publication Data

US 2005/0003647 A1 Jan. 6, 2005

(30) Foreign Application Priority Data

Nov. 28, 2002 (DE) .......................................... 102 55 427

(51) Int. Cl.[7] ........................... H01L 21/82; H01L 29/00
(52) U.S. Cl. ....................... 438/131; 438/467; 438/600; 257/50; 257/530
(58) Field of Search ............................. 438/130, 131, 438/132, 467, 600, 601; 257/50, 528, 529, 530

(56) References Cited

U.S. PATENT DOCUMENTS

| | | | | |
|---|---|---|---|---|
| 5,282,158 A | * | 1/1994 | Lee ............................ | 257/530 |
| 5,395,797 A | * | 3/1995 | Chen et al. .................. | 438/467 |
| 5,852,323 A | * | 12/1998 | Conn .......................... | 257/530 |
| 5,970,372 A | * | 10/1999 | Hart et al. ................... | 438/600 |
| 6,509,624 B1 | * | 1/2003 | Radens et al. .............. | 438/131 |
| 6,534,841 B1 | * | 3/2003 | Van Brocklin et al. ..... | 257/530 |
| 6,740,957 B2 | * | 5/2004 | Porter ......................... | 257/530 |
| 6,844,609 B2 | * | 1/2005 | Motsiff et al. .............. | 438/131 |
| 6,861,727 B2 | * | 3/2005 | Forbes et al. ............... | 438/131 |

FOREIGN PATENT DOCUMENTS

| | | | | |
|---|---|---|---|---|
| EP | 500 034 A1 | 8/1992 | ......... | H01L/23/525 |
| JP | 5-121557 A | 5/1993 | ........... | H01L/21/82 |

OTHER PUBLICATIONS

German Examination Report dated Jun. 27, 2003.

* cited by examiner

Primary Examiner—Kevin M. Picardat
(74) Attorney, Agent, or Firm—Moser, Patterson & Sheridan, L.L.P.

(57) ABSTRACT

Method for producing an antifuse in a substrate, a first interconnect being applied to the substrate, a dielectric layer being applied at an end face of the first interconnect, which end face essentially runs vertically with respect to the substrate, a second interconnect being applied in such a way that it adjoins the dielectric layer with an end face, with the result that an antifuse structure is formed.

23 Claims, 1 Drawing Sheet

METHOD FOR PRODUCING AN ANTIFUSE IN A SUBSTRATE AND AN ANTIFUSE STRUCTURE FOR INTEGRATION IN A SUBSTRATE

CROSS-REFERENCE TO RELATED APPLICATIONS

This application claims priority benefits under 35 U.S.C. §119 to co-pending German patent application 102 55 427.7-33, filed Nov. 28, 2002. This related patent application is herein incorporated by reference in its entirety.

BACKGROUND OF THE INVENTION

1. Field of the Invention

The invention relates to a method for producing an antifuse in a substrate, in particular in an integrated circuit, and an antifuse structure for integration in an integrated circuit.

2. Description of the Related Art

Antifuse structures are used in integrated circuits to permanently store setting values. For this purpose, antifuse structures can be programmed by being changed over from a high-impedance to a low-impedance state by means of an applied programming voltage. The high-impedance and low-impedance states are permanent, i.e., they are maintained permanently without the presence of a voltage. In this way, the antifuse structure can serve as a binary storage element, the two states being determined by the high-impedance state and the low-impedance state.

Antifuse structures usually have a first conductive region and a second conductive region isolated from one another by a dielectric. The dielectric forms a thin layer between the first conductive region and the second conductive region, which layer is initially nonconductive, or at high impedance. When a programming voltage is applied, an electric field forms between the two conductive regions, a breakdown channel forming at that location in the dielectric at which the breakdown field strength of the dielectric is exceeded by the electric field, which breakdown channel permanently alters the dielectric in such a way that a low-impedance channel is formed.

Conventional antifuse structures are usually produced by stacking layers one on top of the other, the method steps of deposition of a first conductive layer, patterning of the first conductive layer, deposition of a dielectric layer, patterning of the dielectric layer and deposition of a second conductive layer and patterning of the second conductive layer essentially being carried out one after the other.

In order to deposit said layers one above the other, relatively large overlay tolerances are necessary, with the result that when the feature sizes of the integrated circuit are miniaturized, the layers of the antifuse structure cannot be miniaturized to the same extent.

SUMMARY OF THE INVENTION

It is an object of the present invention to provide a method for producing an antifuse structure in a substrate and an antifuse structure, free scalability of the antifuse structure being afforded.

A first aspect of the present invention provides a method for producing an antifuse in a substrate. For this purpose, a first interconnect is applied to the substrate, a dielectric layer being applied at an end face of the first interconnect, which end face essentially runs vertically with respect to the substrate. A second interconnect is subsequently applied to the substrate in such a way that it adjoins the dielectric layer with an end face, with the result that an antifuse structure is formed.

The production method according to the invention for an antifuse has the advantage that it is possible to avoid overlay tolerances in the mask process and negative effects such as, e.g., "void" formation in the case of the metal fill. As a result, free scalability is possible in the case of the invention's method for producing the antifuse. It may be provided that the dielectric layer is applied isotropically, with the result that edges of the first interconnect are covered. The possibility of short circuits with respect to the edges of the first interconnect arising during the application of the second interconnect is avoided in this way.

It may be provided that the dielectric layer is applied with the aid of an anisotropic deposition process by carrying out the deposition process obliquely with respect to the surface of the substrate. Consequently, the dielectric layer can be applied on the end face in a simple manner, improved edge coverage also being ensured by the direction of the deposition process obliquely with respect to the surface.

It may be provided that the first interconnect is applied in such a way that it terminates with a surface of the substrate. This may preferably be carried out in such a way that the first interconnect is introduced into a trench structure in the substrate and the surfaces of the first interconnect and of the substrate are subsequently processed in such a way that they terminate with one another in a common surface. In order to form an antifuse structure, the second interconnect is preferably introduced into a second trench structure in the substrate, the second trench structure being arranged in such a way that the second interconnect introduced therein is connected to the dielectric layer by its end face.

In this way, it is possible to produce an antifuse structure which is introduced in a continuous interconnect formed from the first interconnect and the second interconnect, so that the antifuse structure thus formed takes up only a small area. Furthermore, the process is self-aligning since the dielectric layer can be produced without a mask step.

It may be provided that, for the purpose of introducing the conductor material for the first interconnect into the first trench structure, firstly a sacrificial material is introduced into the second trench structure, the conductor material for the first interconnect being applied over the area. The conductor material is subsequently removed above the second trench structure by removing the sacrificial material. As an alternative, it is also possible to remove the conductor material by means of a CMP process, the conductor material essentially being completely removed everywhere except in the first trench structure, so that only the conductor material in the first trench structure and the sacrificial material in the second trench structure remain. Afterward, in order to introduce the dielectric layer and the second interconnect, the sacrificial material may be removed and the dielectric layer and the second interconnect may be introduced.

A further aspect of the present invention provides an antifuse structure in a substrate with a dielectric layer between a first interconnect and a second interconnect. The dielectric layer is essentially arranged vertically with respect to the surface of the substrate and arranged between end faces of the first and second interconnects.

In this way, it is possible to produce an antifuse structure which is essentially freely scaleable and needs a smaller area requirement than conventional antifuse structures.

It may be provided that the first interconnect, the dielectric layer and the second interconnect are arranged in a trench structure in a substrate. The trench structure has the advantage in the production method that the processes are self-aligning, so that, e.g., the production of the dielectric layer does not require a further mask process.

It may be provided that the first interconnect, the dielectric layer and the second interconnect are arranged in the substrate in such a way that their surfaces terminate with the surface of the substrate. In this way, it is possible to produce a surface on which further layers can be applied, e.g., in order to form further metallization layers.

BRIEF DESCRIPTION OF THE DRAWINGS

Preferred embodiments of the invention are explained in more detail below with reference to the accompanying drawings, in which.

DETAILED DESCRIPTION OF THE PREFERRED EMBODIMENT

Figure 1A:
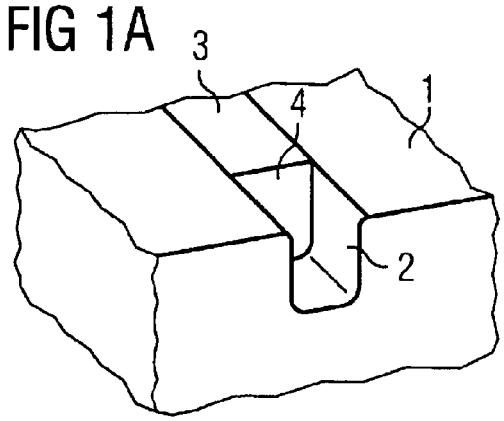
FIGS. 1a to 1c show the individual method steps according to the invention in accordance with a first embodiment of the invention.
Figure 1B:
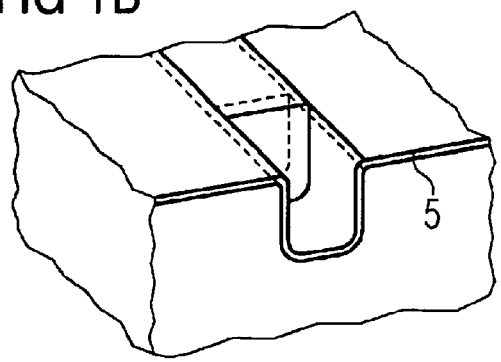
Figure 1C:
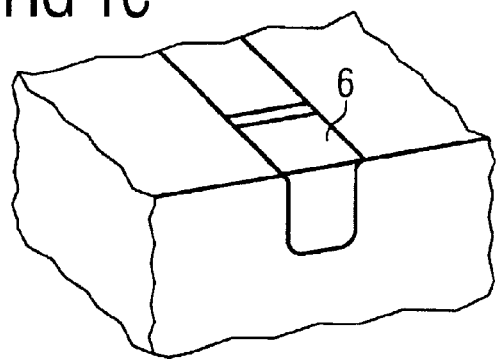

FIGS. 1a to 1c illustrate, in accordance with a first embodiment of the invention, the method steps for producing an antifuse structure in a substrate 1. A trench structure 2 is introduced into the substrate, which trench structure is intended to accommodate the later interconnect and the antifuse structure.

The trench structure 2 is preferably arranged in an ILD region (Inter Layer Dielectric). After the deposition of the first metal layer and the subsequent CMP process, the conductor material is removed from the second part of the trench structure with the aid of an RIE method.

A first interconnect 3 is then introduced into a first part of the trench structure 2, which interconnect ends in the trench structure 2 at the position of the later antifuse structure and has an end face 4. The first interconnect 3 can be introduced in various ways. By way of example, it is possible to apply a layer with conductive material over the trench structure 2, which layer is deposited over the area, that is to say both on the substrate surface 1 and in the trench structure 2. Afterward, by means of masking, the layer with conductive material can be removed in such a way that only the first interconnect 3 remains and the conductive material situated on the substrate surface 1 and in a second part of the trench structure 2 is removed. The conductive material is preferably a metallic material, and may comprise, by way of example, aluminum, copper, tungsten and/or other conductor materials known in semiconductor technology.

The end face 4 preferably runs vertically with respect to the substrate surface, but may also run obliquely with respect to the substrate surface, depending on the production process. Running obliquely has the advantage that the area between the conductor and the dielectric can be enlarged, so that a high breakdown probability can be achieved during the later "blowing" of the antifuse and it is thus possible to improve the overall yield of an integrated circuit with such antifuse structures. In particular, from a process engineering standpoint, angles of between 0° and 60° between the normal to the surface and the end face are advantageous since these can be achieved in a simple manner by tilting the substrate wafer during a lithography step.

FIG. 1b illustrates that a dielectric layer 5 is applied to the structure thus obtained. The dielectric layer 5 must be applied in such a way that the end face 4 is completely covered in a defined manner. In particular, the edges of the end face 4 should be covered in order to avoid a short circuit between the first interconnect and a second interconnect 6 that is subsequently to be applied.

In order to achieve this, an isotropic deposition process is preferably used for depositing the dielectric layer 5. When using an anisotropic deposition process, it is preferably to be provided that the material to be deposited is applied obliquely to the substrate surface, so that the angle of application to the end face 4 becomes as large as possible, and is as far as possible 90° in the optimum case. This is possible in a particularly simple manner if the end face runs oblique with respect to the surface.

The dielectric layer 5 is nonconductive and may essentially comprise all dielectric materials known in semiconductor technology. Silicon nitrite may preferably be used as the dielectric.

Since the dielectric layer 5 is very thin, e.g., 3 nm, in comparison with the order of magnitude of the trench structure 2, the dielectric layer 5 may remain in the trench structure when the second interconnect is introduced into the second part of the trench structure 2, and serves as additional insulation of the second interconnect from the substrate 1, as a result of which leakage currents can be reduced. Therefore, the location of the antifuse structure should preferably be chosen in such a way that the length of the interconnect is essentially formed by the second interconnect and the first interconnect is kept as short as possible.

The introduction of the second interconnect 6 is effected in the same way as the introduction of the first interconnect by deposition of a conductor material and subsequent removal of the conductor material from the substrate surface. The removal of excess conductor material from the substrate surface may be carried out by means of a CMP method.

This results in an antifuse structure in which the dielectric layer 5 is essentially arranged vertically or obliquely with respect to the interconnect. The antifuse structure which has been produced by the method according to the invention has the advantage that it is essentially freely scaleable and that it forms an essentially planar surface with the substrate surface, so that further metal layers or other layers can be arranged thereabove.

It may be provided that, in addition to the dielectric layer 5, an electrode layer (not shown) made of a readily migrating material, e.g., WSi, is also deposited isotropically. The electrode layer made of readily migrating material improves the breakdown behavior and, during the blowing of the antifuse, ensures that the breakdown channel does not recede during the lifetime of the circuit.

It goes without saying that provision may also be made for arranging the antifuse structure according to this invention on the substrate surface rather than in a trench structure. The advantage of providing the antifuse structure in the trench structure 2 is that the processes are essentially self-aligning, in particular the process of depositing the dielectric layer 5.

Figure 2:
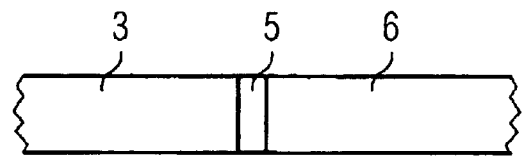
FIG. 2 shows a cross section through an antifuse structure according to the invention.

FIG. 2 shows a cross section along the interconnect of the antifuse structure, as illustrated in FIG. 1c. It can be seen that the dielectric layer is essentially situated vertically in the interconnect in such a way that the two parts of the interconnect are not connected to one another, but rather are connected only via the dielectric layer 5.

What is claimed is:

1. A method for producing an antifuse on a substrate, comprising:

forming a first interconnect on the substrate, the first interconnect having a first planar end face substantially perpendicular with respect to an upper surface of the substrate;

depositing a dielectric layer at the planar end face of the first interconnect; and forming a second interconnect, the second interconnect having a second planar end face substantially perpendicular with respect to the upper surface of the substrate and disposed in facing relation to the first planar end face so that the dielectric layer is interposed between the first planar end face and the second planar end face.

2. The method of claim 1, wherein depositing the dielectric layer comprises isotropically depositing the dielectric layer, so that edges of the first interconnect are covered.

3. The method of claim 1, wherein depositing the dielectric layer comprises anisotropically depositing the dielectric layer at an oblique angle relative to the upper surface of the substrate.

4. The method of claim 1, wherein a portion of the dielectric is disposed between the substrate and the second interconnect.

5. The method of claim 1, wherein respective upper surfaces of the first interconnect, the second interconnect and the dielectric layer form a common planar surface.

6. The method of claim 5, wherein the common planar surface is coplanar with the upper surface of the substrate.

7. A method for producing an antifuse on a substrate, comprising:

forming a trench in the substrate; wherein the trench has a central axis substantially parallel to the upper surface of the substrate;

forming a first interconnect in a first portion of the trench, the first interconnect having a first planar end face;

depositing a dielectric layer in a second portion of the trench at the planar end face of the first interconnect;

forming a second interconnect in a third portion of the trench, the second interconnect having a second planar end face substantially perpendicular with respect to the upper surface of the substrate and disposed in facing relation to the first planar end face so that the dielectric layer is interposed between the first planar end face and the second planar end face.

8. The method of claim 7, wherein depositing the dielectric layer comprises isotropically depositing the dielectric layer, so that edges of the first interconnect are covered.

9. The method of claim 7, wherein forming the first interconnect comprises:

depositing a sacrificial material into the first, second and third portions of the trench; and depositing a conductive material over the sacrificial material in the first, second and third portions of the trench;

removing a portion of the conductive material to form the first interconnect in the trench.

10. The method of claim 7, wherein the dielectric is deposited in the second and third portion of the trench and not the first portion of the trench.

11. The method of claim 7, wherein depositing the dielectric layer comprises isotropically depositing the dielectric layer, so that edges of the first interconnect are covered.

12. The method of claim 7, wherein depositing the dielectric layer comprises anisotropically depositing the dielectric layer at an oblique angle relative to the upper surface of the substrate.

13. The method of claim 7, wherein respective upper surfaces of the first interconnect, the second interconnect and the dielectric layer form a common planar surface.

14. The method of claim 13, wherein the common planar surface is coplanar with the upper surface of the substrate.

15. An antifuse structure in a substrate, comprising:

a first interconnect defining a first planar end face;

a second interconnect defining a second planar end face; and a dielectric layer disposed between the first and second planar end faces and having a substantially vertical orientation with respect to a substantially horizontal upper surface of the substrate.

16. The antifuse structure of claim 15, wherein respective upper surfaces of the first interconnect, the second interconnect and the dielectric layer form a common plane coplanar with the horizontal upper surface of the substrate.

17. The antifuse structure of claim 15, wherein at least one of the planar end faces is oblique with respect to the horizontal upper surface of the substrate.

18. The antifuse structure of claim 15, wherein the first interconnect is shorter than the second interconnect.

19. An antifuse structure in a substrate, comprising:

a first interconnect defining a first planar end face and disposed in a trench formed in the substrate;

a second interconnect defining a second planar end face and disposed in the trench; and a dielectric layer disposed in the trench and between the first and second planar end faces and having a substantially vertical orientation with respect to a substantially horizontal upper surface of the substrate.

20. The antifuse structure of claim 19, wherein respective upper surfaces of the first interconnect, the second interconnect and the dielectric layer form a common plane coplanar with the horizontal upper surface of the substrate.

21. The antifuse structure of claim 19, wherein at least one of the planar end faces is oblique with respect to the horizontal upper surface of the substrate.

22. The antifuse structure of claim 19, wherein the first interconnect is shorter than the second interconnect.

23. The antifuse structure of claim 19, wherein the dielectric layer is made of a dielectric material a portion of which is disposed between the second interconnect and the substrate.

* * * * *